(12) United States Patent
Xue

(10) Patent No.: US 9,278,851 B2
(45) Date of Patent: *Mar. 8, 2016

(54) VERTICAL MOUNT PACKAGE AND WAFER LEVEL PACKAGING THEREFOR

(71) Applicant: ANALOG DEVICES, INC., Norwood, MA (US)

(72) Inventor: Xiaojie Xue, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/484,151

(22) Filed: Sep. 11, 2014

(65) Prior Publication Data
US 2014/0374854 A1 Dec. 25, 2014

Related U.S. Application Data

(63) Continuation of application No. 13/438,370, filed on Apr. 3, 2012, now Pat. No. 8,836,132.

(51) Int. Cl.
*H01L 23/48* (2006.01)
*B81B 7/00* (2006.01)
(Continued)

(52) U.S. Cl.
CPC ........... *B81B 7/0077* (2013.01); *B81C 1/00325* (2013.01); *B81C 1/00333* (2013.01);
(Continued)

(58) Field of Classification Search
CPC ................. B81B 7/0077; B81B 2201/0242; B81B 2201/025; B81B 2207/095; B81B 2207/096; B81C 1/00873; B81C 1/00333; B81C 1/00325; B81C 2203/0118; H01L 25/0655; H01L 23/49805; H01L 23/041; H01L 21/50; H01L 2924/0002; H01L 24/95; H01L 24/96; H01L 24/97
USPC ........................................................ 257/773
See application file for complete search history.

(56) References Cited

U.S. PATENT DOCUMENTS 3,949,274 A    4/1976  Anacker
4,742,183 A    5/1988  Soloway et al.
(Continued)

FOREIGN PATENT DOCUMENTS

JP         09121015 A    5/1997

OTHER PUBLICATIONS

Images obtained on Jun. 13, 2011 from a web search related to three-dimensional packaging.
(Continued)

*Primary Examiner* — Douglas Menz
(74) *Attorney, Agent, or Firm* — Knobbe Martens Olson & Bear LLP

(57) ABSTRACT

Vertical mount packages and methods for making the same are disclosed. A method for manufacturing a vertical mount package includes providing a device substrate with a plurality of device regions on a front surface, and a plurality of through-wafer vias. MEMS devices or integrated circuits are formed or mounted onto the device regions. A capping substrate having recesses is mounted over the device substrate, enclosing the device regions within cavities defined by the recesses. A plurality of aligned through-wafer contacts extend through the capping substrate and the device substrate. The device substrate and capping substrate can be singulated by cutting through the aligned through-wafer contacts, with the severed through-wafer contacts forming vertical mount leads. A vertical mount package includes a device sealed between a device substrate and a capping substrate. At least of the side edges of the package includes exposed conductive elements for vertical mount leads.

37 Claims, 6 Drawing Sheets

(51) Int. Cl.
  *H01L 21/50*   (2006.01)
  *H01L 23/04*   (2006.01)
  *H01L 23/498*  (2006.01)
  *H01L 25/065*  (2006.01)
  *B81C 1/00*    (2006.01)
  *H01L 23/00*   (2006.01)

(52) U.S. Cl.
  CPC ............ *B81C1/00873* (2013.01); *H01L 21/50* (2013.01); *H01L 23/041* (2013.01); *H01L 23/49805* (2013.01); *H01L 24/97* (2013.01); *H01L 25/0655* (2013.01); *B81B 2201/025* (2013.01); *B81B 2201/0242* (2013.01); *B81B 2207/095* (2013.01); *B81B 2207/096* (2013.01); *B81C 2203/0118* (2013.01); *H01L 2224/16225* (2013.01); *H01L 2224/48227* (2013.01); *H01L 2224/97* (2013.01); *H01L 2924/0002* (2013.01); *H01L 2924/14* (2013.01); *H01L 2924/1461* (2013.01)

(56)  References Cited

U.S. PATENT DOCUMENTS

| | | |
|---|---|---|
| 5,126,286 A | 6/1992 | Chance |
| 5,452,182 A | 9/1995 | Eichelberger et al. |
| 5,554,806 A | 9/1996 | Mizuno et al. |
| 5,555,159 A | 9/1996 | Dore |
| 5,616,863 A | 4/1997 | Koen |
| 5,731,222 A | 3/1998 | Malloy et al. |
| 5,903,440 A | 5/1999 | Blazier et al. |
| 6,040,624 A | 3/2000 | Chambers et al. |
| 6,075,708 A | 6/2000 | Nakamura |
| 6,291,894 B1 | 9/2001 | Farnworth et al. |
| 6,339,191 B1 | 1/2002 | Crane, Jr. et al. |
| 6,348,427 B1 | 2/2002 | Hamada et al. |
| 6,475,832 B2 | 11/2002 | Crane et al. |
| 6,511,863 B2 | 1/2003 | Farnworth et al. |
| 6,570,246 B1 | 5/2003 | Lee et al. |
| 6,591,492 B2 | 7/2003 | Farrar |
| 6,705,005 B1 | 3/2004 | Blazier et al. |
| 6,721,189 B1 | 4/2004 | Haba |
| 6,777,261 B2 | 8/2004 | Farnworth et al. |
| 6,852,607 B2 | 2/2005 | Song et al. |
| 6,903,465 B2 | 6/2005 | Farnworth et al. |
| 7,012,812 B2 | 3/2006 | Haba |
| 7,115,984 B2 | 10/2006 | Poo et al. |
| 7,202,552 B2 | 4/2007 | Zhe et al. |
| 7,211,886 B2 | 5/2007 | Hsu et al. |
| 7,265,719 B1 | 9/2007 | Moosbrugger et al. |
| 7,375,009 B2 | 5/2008 | Chua et al. |
| 7,420,262 B2 | 9/2008 | Bauer et al. |
| 7,429,788 B2 | 9/2008 | Clayton et al. |
| 7,467,552 B2 | 12/2008 | MacGugan |
| 7,839,657 B2 | 11/2010 | Nodine |
| 8,692,366 B2 * | 4/2014 | Xue et al. ............ 257/692 |
| 8,836,132 B2 * | 9/2014 | Xue .................. 257/773 |
| 2003/0209789 A1 | 11/2003 | Hanson et al. |
| 2004/0157410 A1 | 8/2004 | Yamaguchi |
| 2004/0169244 A1 | 9/2004 | MacGugan |
| 2005/0230795 A1 | 10/2005 | Furuyama et al. |
| 2006/0151864 A1 | 7/2006 | Anderson et al. |
| 2006/0261453 A1 | 11/2006 | Lee et al. |
| 2007/0053504 A1 | 3/2007 | Sato et al. |
| 2008/0175425 A1 | 7/2008 | Roberts et al. |
| 2008/0285111 A1 | 11/2008 | Ishii et al. |
| 2009/0121342 A1 | 5/2009 | Minakawa et al. |
| 2010/0078739 A1 | 4/2010 | Xue et al. |
| 2010/0090295 A1 | 4/2010 | Zhe et al. |
| 2010/0155863 A1 | 6/2010 | Weekamp |
| 2010/0197148 A1 | 8/2010 | Rudisill et al. |
| 2011/0018143 A1 | 1/2011 | Chua et al. |
| 2011/0149522 A1 | 6/2011 | Johann et al. |

OTHER PUBLICATIONS

Sensors—HARTING Mitronics, HARTING Pushing Performance, in 2 pages (downloaded from World Wide Web page: harting-mitronics.ch/en/produkte/anwendungen/sensorik/index.php on Jul. 11, 2011).

* cited by examiner

VERTICAL MOUNT PACKAGE AND WAFER LEVEL PACKAGING THEREFOR

CROSS-REFERENCE TO RELATED APPLICATIONS

This application is a continuation of U.S. patent application Ser. No. 13/438,370, filed on Apr. 3, 2012, and entitled "VERTICAL MOUNT PACKAGE AND WAFER LEVEL PACKAGING THEREFOR," which is hereby incorporated by reference herein in its entirety and for all purposes.

BACKGROUND OF THE INVENTION

1. Field of the Invention

Embodiments of the invention relate to vertical mount packages for integrated circuits or microelectromechanical systems (MEMS) devices.

2. Description of the Related Art

Microelectromechanical systems (MEMS) devices refer to very small mechanical devices driven by electricity. MEMS devices can include one or more of mechanical elements, sensors, and actuators formed on a substrate, such as a silicon substrate, through micro fabrication technology. Such MEMS devices in a state before packaging can also be referred to as a "MEMS die" in the context of this document. In this document, "dies" is used as a plural form of "die," but "dice" can also be used as a plural form.

MEMS dies are typically placed in a package (hereinafter, referred to as "MEMS package") to protect the MEMS dies and facilitate electrical connection to larger electronic devices. Such MEMS packages are often designed to be attached to a printed circuit board (PCB) or similar interface for larger devices. A MEMS package can typically include a casing defining a cavity to contain a MEMS die, bond pads for electrical connection to the MEMS die, leads for electrical connection to a larger device, and interconnects for electrical connection between the bond pads and the leads. A MEMS die is attached to a mounting surface of the MEMS package, and can be electrically connected to the bond pads, e.g., via bond wires. The cavity can be defined in various ways, such as a substrate and metal "can" or three-dimensional lid, a molded package with integrated substrate and walls with a planar lid, etc.

Other devices, such as application-specific integrated circuits (ASICs) and memory chips, can be similarly packaged for protection and to facilitate electrical connection of devices to larger electrical circuits. Such IC dies can be independently packaged or packaged together with MEMS devices.

Most packages are designed to mount onto larger boards with the die parallel to the mounting board. Dies that are to be mounted vertically with respect to the mounting surface, such as gyroscopes and other motion sensors, present additional challenges for efficient component manufacturing and assembly of packages.

SUMMARY OF THE INVENTION

In one embodiment, a method of manufacturing a vertical mount package is provided. The method includes providing a device substrate having a front surface with a plurality of device regions, and a rear surface opposite the front surface. The method further includes sealing devices on the device regions on the device substrate, and dicing the device substrate to form a plurality of packages. Each of the packages includes a plurality of side edges between the front and rear surfaces, and at least one of the side edges includes exposed conductive elements for vertical mount leads. Each of the resulting plurality of packages includes at least one device region.

In another embodiment, a method of manufacturing a vertical mount package is provided. The method includes providing a device substrate comprising a plurality of through-substrate contacts extending between front and rear surfaces of the device substrate. A plurality of devices are sealed on the front surface of the device substrate. The method further includes dicing the device substrate through at least some of the plurality of through-substrate contacts, each of the severed through-substrate contacts forming a vertical mount lead.

In another embodiment, a vertical mount package is provided. The package includes a device substrate having a front surface with at least one device disposed thereon, and a rear surface opposite the front surface. The package further includes a capping substrate having a front surface and a rear surface opposite the front surface. The capping substrate is disposed over the device substrate such that the rear surface of the capping substrate faces the front surface of the device substrate. The at least one device is sealed within a cavity defined by the device substrate and the capping substrate. The package further includes a plurality of side edges extending between the front surface of the capping substrate and the rear surface of the device substrate, at least one of the side edges including exposed conductive elements for vertical mount leads.

In another embodiment, a vertical mount package is provided. A device substrate comprises a front surface and a rear surface opposite the front surface. The substrate can be made of glass or silicon. At least one device is sealed on the front surface of the device substrate, and a rear surface opposite the front surface. A plurality of side edges extend between the front and rear surfaces of the device substrate surface. At least one of the side edges includes exposed conductive elements for vertical mount leads.

DETAILED DESCRIPTION OF EMBODIMENTS

Figure 1:
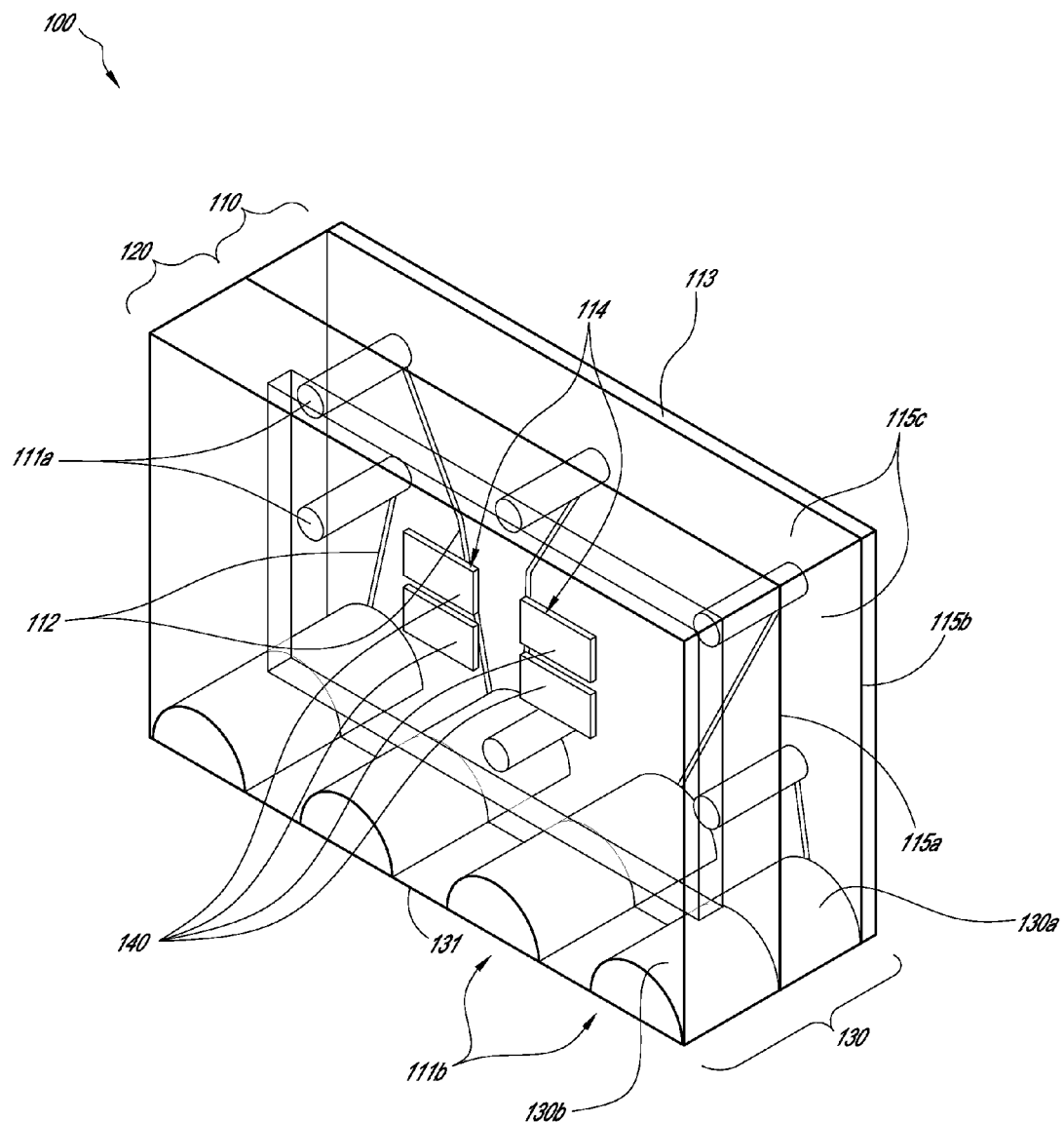
FIG. 1 is a schematic perspective front view of a MEMS package according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Vertical Mount Package

A MEMS package is designed to protect a MEMS device and facilitate electrical connection to larger electronic devices. In some applications, a MEMS package can be mounted on a printed circuit board (PCB) such that a MEMS device therein is oriented substantially parallel to a mounting surface of the PCB. In other applications, a MEMS package desirably has a MEMS device therein oriented substantially perpendicular to a mounting surface of a PCB because of the operation of the MEMS device.

For example, in some automotive applications, such as vehicle stability control devices, rotation or angular sensors (alternatively, referred to as "gyroscopes") and/or motion sensors (alternatively, referred to as "accelerometers") are oriented vertically on a horizontally mounted part inside a vehicle. In the context of this document, the term "vertical" can refer to the orientation approximately perpendicular to the package mounting plane (e.g., on a motherboard), which can be but is not necessarily parallel to ground. Rotation sensors and motion sensors can be collectively referred to as "inertial sensors."

Such inertial sensors can be oriented vertically using a vertical mount package, which is configured to mount vertically and make electrical connections to a horizontal mounting surface. However, known schemes for vertical mount packages can be expensive and have several limitations. For example, as vertical mount packages can be more susceptible to vibration and package tilt than horizontal mount packages. Accordingly, there is a need for providing a vertical mount package that can tolerate such conditions such that the operations of MEMS devices (and/or other types of dies) therein are not adversely affected. Among other attributes, vertical mount packages should have low height and low manufacturing costs while maintaining or improving overall performance.

In one embodiment, a vertical mount package can include a substrate having a plurality of device regions on a front surface, and a rear surface opposite the front surface. The package further includes a lid or capping substrate covering the device regions while providing a cavity for containing MEMS or IC devices and the electrical connections therefor. The term "lid," "cap," or "capping substrate" can be used interchangeably within the context of this document. In addition, the package includes a plurality of exposed conductive elements on a bottom edge of the substrate. Advantageously, the packaging structures and methods taught herein can be applied to either to independently mounted MEMS and/or IC dies, or to integrally formed MEMS and/or IC devices in the same substrate that is used for packaging. The substrate on which the devices can be either integrally formed using semiconductor processing techniques, or on which devices can be mounted, can be referred to as a "device substrate." The ability to employ the same substrate both for fabrication of the devices and packaging can effectively eliminate the use of separate packaging substrates and provide for very low profile and small area packages where the fabricated die doubles as a packaging substrate.

Referring to FIG. 1, a vertical mount package according to one embodiment is shown. The illustrated package 100 includes a device substrate 110, a capping substrate 120, and a plurality of leads 130. The leads 130 comprise exposed conductive elements, and can provide for electrical connection to another device. The package 100 can be attached to a larger electronic device, such as by way of a printed circuit board (PCB) (not shown), by attaching the leads 130 to the PCB, using, for example, solder joints. The leads 130 each comprise a first segment 130a integrated with the device substrate 110. The first segment 130a is aligned with a second segment 130b, which is integrated with the capping substrate 120. When the capping substrate 120 is mounted over the device substrate 110, the first and second segments 130a, 130b are aligned and join to form a single lead 130.

The device substrate 110 serves to support one or more devices. The devices can include one integrated circuits (ICs) and/or MEMS devices that are fabricated directly onto the device substrate 110. In some embodiments, the devices can include one or more dies, such as IC and/or MEMS dies, that are formed separately and then mounted onto the device substrate 110. The device substrate 110 has a front surface 115a and a rear surface 115b opposite the front surface 115a. A plurality of edges 115c extend between the front and rear surfaces 115a and 115b. In one embodiment, the device substrate 110 can be formed of, for example, glass. In other embodiments, the device substrate 110 can be formed of silicon. Similarly, in various embodiments the capping substrate 120 can be formed of glass or silicon. A plurality of lesser vias 111a (illustrated as cylindrical but can have other shapes) extend through the device substrate 110, as do four aligned greater vias 111b (illustrated as hemi-cylindrical but can have other shapes). The greater vias 111b are filled with conductive material which form the leads 130.

The device substrate 110 can also include electrical contacts in the form of traces 112 on the rear surface 115b of the device substrate 110. The traces 112 can extend to one or more of the plurality of the lesser vias 111a. Like the greater vias 111b, the lesser vias 111a are filled with conductive material and connect at the front surface 115a of the device substrate 110 to the plurality of device regions 114.

One or more devices 140 can be arranged on the device regions 114 on the front surface 115a of the device substrate 110. In the illustrated embodiment, the MEMS package 100 includes four devices 140. In other embodiments, the number of devices in a package can vary widely, depending on the design of the package. For example, a package can include a single device, or three or more devices. As noted above, the devices 140 can include MEMS structures or ICs that are fabricated directly onto the device regions 114 using semiconductor processing techniques, in which case the substrate 110 itself can be considered a die (after dicing). Alternatively, the devices 140 can be independently fabricated MEMS structures and/or ICs that are fabricated on separate substrates, diced, and then the dies are mounted onto the device regions 114. In some embodiments, a package can include one or more MEMS devices, and one or more Application-Specific Integrated Circuits (ASIC).

Each of the devices can include one or more MEMS structures, such as a gyroscope, an accelerometer, a MEMS microphone, thermal sensor, and the like. Advantageously, one or more of the devices can be integrally formed on the device substrate 110 using semiconductor processing techniques, such as gas phase deposition, photolithography, etching, etc. In some embodiments, two or more devices can be stacked over one another (if separately mounted), or connected to one another side-by-side. In some embodiments, the MEMS devices can include a movable membrane, for example for motion or acoustic sensors. Upon mounting of the package, the membrane can be configured to lie substantially parallel to the vertical, and to move in a direction substantially perpendicular to the vertical.

The devices 140 are electrically coupled by way of traces on the front surface 115a of the device substrate 110 to the lesser vias 111a. In embodiments in which the devices 140 are formed on separate dies and then mounted onto the device regions 114, the dies can be flip-chip mounted, using BGA, ACF, or NCP technology, or can be wire bonded, as is known in the art, to connect by surface traces to the lesser vias 111a. The capping substrate 120 has a cavity formed therein such that the capping substrate 120 does not contact the devices 140 (whether integrally formed or mounted) when the capping substrate 120 is attached to the device substrate 110. By having the capping substrate 120 spaced apart from the devices 140 without an encapsulant, the devices 140 can minimize stress and allow free motion for MEMS membranes. The capping substrate 120 can be attached to the device substrate 110, using adhesive material, such as epoxy, formed along the periphery of the front surface 115a of the device substrate 110. Conversely, the devices can be arranged in a cavity in the device substrate 110 and the capping substrate 120 can be planar or also have a cavity. In some embodiments, the capping substrate 120 can be attached to the device substrate 110 using wafer bonding, for example glass frit (non-conductive) or metal-to-metal (conductive) bonding.

The leads 130 serve to provide electrical connection between the devices 140 and the larger electronic system, e.g., through pads of a PCB (not shown) on which the MEMS package 100 is mounted. As will be described in more detail below, the lead 130 can be manufactured by cutting a wafer through the center-line of a plurality of greater vias 111b. In some embodiments, the wafer can be cut through the plurality of greater vias 111b, but along a line offset from the center-line. The leads 130, by being attached to pads on a PCB via solder joints, can also provide mechanical support for the package 100. In the illustrated embodiment, the leads 130 are elongated parallel to one another in a direction perpendicular to the front surface 115a of the device substrate 110.

The leads 130, as illustrated, are half-cylinders of conductive material formed in grooves in the device substrate 110. Depending upon the original shape of the greater vias 111b, the leads 130 can assume various other shapes. The bottom surface 131 of the leads 130 is formed along the lower of side edges 115c. As will be described in more detail below, the exposed bottom surface 131 of leads 130 is formed as along a side edge of the device substrate and lid during manufacturing. The package 100 can be rotated for mounting, such that the side edge with exposed leads 130 faces downward. In this orientation, bottom surface 131 can provide surface area for bonding with solder when the package 100 is attached to a PCB. Moreover, the leads 130 provide solder-wettable surfaces visible from both the front and rear sides of the package 100 after being mounted on a PCB. In general, the larger the area of contact between leads of a package and a PCB, the better is the solder joint reliability (SJR) of the package, and having visible side, front, and rear surfaces allows for visual inspection. In the illustrated embodiment, the exposed conductive portions 130 form leads having a relatively long length, extending the entire width of the device substrate 110 and the capping substrate 120. As illustrated, the majority of the surface of each lead 130 is on the bottom of the package 100 (along side edge 115c), while a minority surface of each lead 130 is also exposed on front and rear surfaces of the package 100, which surfaces are visible after mounting.

In the illustrated package 100, the vertical direction is parallel to the major surfaces of the devices 140 and to the major surfaces of the device substrate 110 and the capping substrate 120. In embodiments in which the devices 140 are MEMS structures, the vertical direction is perpendicular to the direction in which the MEMS membrane vibrates.

Method of Making a Vertical Mount Package

Referring to FIGS. 2A-2H, a method of making a vertical mount package according to one embodiment will be described. In the illustrated embodiment, a device substrate 210 having a plurality of pre-formed through-vias 211a and 211b is provided. The substrate 210 can be a substantially circular wafer. Such wafers can vary in size depending upon manufacturing needs and available processing equipment. Round wafers can have diameters of 200 mm, 300 mm, or 450 mm. Such wafers can be processed using standard wafer processing equipment, as will be apparent to the skilled artisan. In some embodiments, the substrate may be made of glass. In other embodiments, the substrate may be made of silicon. Glass substrates are often employed for integral fabrication of MEMS devices thereon using semiconductor processing techniques; silicon has the advantage of additionally being useful for fabrication of more complex devices such as integrated circuit processors or ASICs. The skilled artisan will appreciate that other materials may be used, depending on the requirements of a particular application. Greater vias 211b have a substantially larger cross-sectional area than lesser vias 211a, as shown in the enlarged view of a portion of the device substrate 210 in FIG. 2B. The device substrate 210 can have a plurality of device regions 214 on which a plurality of devices 240 (FIG. 2C) can be arranged. The skilled artisan will appreciate that many more packages can be formed from a single substrate during manufacturing, and that only the portions of the device substrate 220 representing two packages are shown in FIGS. 2B-2H for purposes of illustration.

As illustrated, the device substrate 210 includes a plurality of pre-formed vias 211a and 211b. Utilizing pre-formed vias can reduce manufacturing complexity, as it eliminates the need for the package manufacturer to undertake the expensive via etching process. In other embodiments, the device substrate 210 can begin with a standard wafer, and vias can be formed during the proceeding wafer fabrication process. In embodiments utilizing a glass substrate, various benefits can be realized. For example, the high resistivity of a glass substrate can increase the electrical performance of the devices. In the case of optical devices, the transparent glass lid can provide an optical path for the packaged devices to communicate with external signals transmitted through the lid. Additionally, by adjusting the doping of the glass, the coefficient of thermal expansion (CTE) of the glass substrate can be altered to match the CTE of the packaged devices, whether integrally formed or mounted. This can advantageously reduce stress on the substrate and the devices, thereby increasing robustness and performance.

Figure 2A:
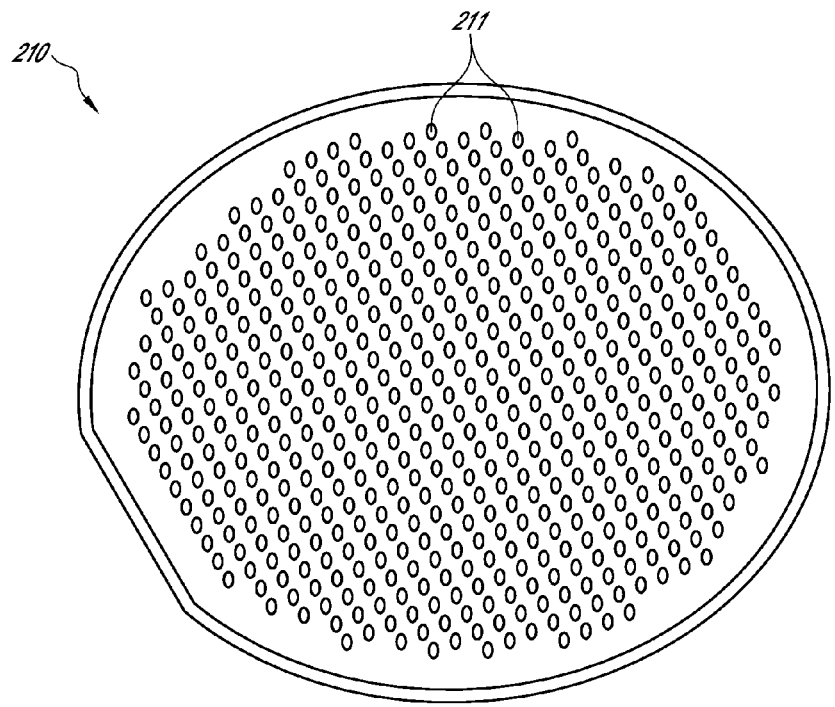
FIGS. 2A-2H are perspective views illustrating a method of making a MEMS package according to one embodiment.
Figure 2B:
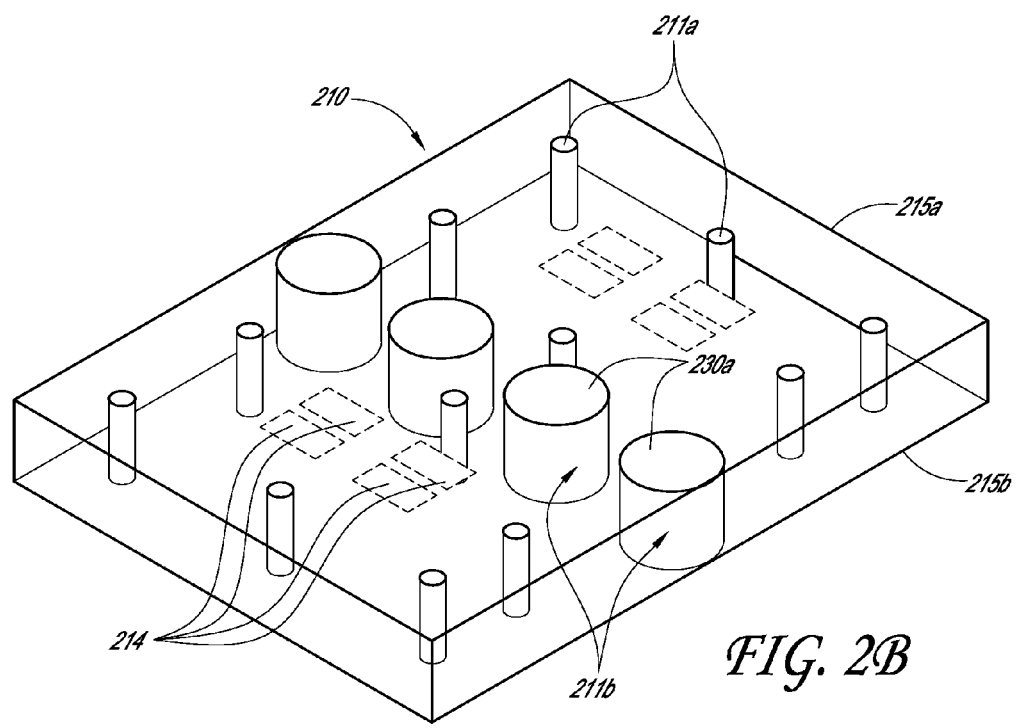

With reference to FIG. 2B, greater vias 211b are illustrated as aligned along an axis. As will be discussed in more detail below, this alignment can allow for singulation to create exposed conductive elements for vertical mount leads. Although FIG. 2B illustrates four aligned greater vias 211b, the number of greater vias 211b can vary depending on the number of leads desired for each package formed by the method. Greater vias 211b are filled with conductive material 230a, which forms a first segment of vertical mount leads, as described below. The lesser vias 211a are likewise filled with conductive material, allowing for electrical connection between the front surface 215a and the rear surface 215b. The conductive material can be deposited in the greater and lesser vias 211a and 211b using standard processes, for example electroplating. In some embodiments, the greater and lesser vias 211a and 211b can be coated with a conductive material without being completely filled, leaving a hole through the vias. In other embodiments, the greater and lesser vias 211a and 211b can be coated with a conductive material, then filled with a different conductive material to increase the conductivity.

Figure 2C:
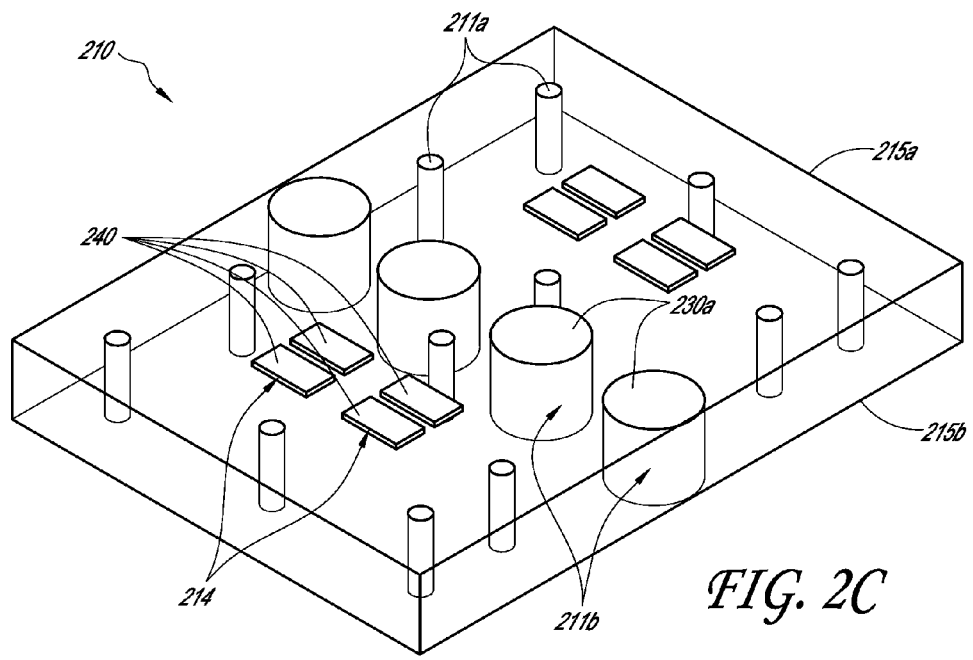

With reference to FIG. 2C, the front surface 215a of the device substrate 210 includes a plurality of device regions 214. Devices 240 are arranged on the device regions 214. In some embodiments, the devices 240 can include MEMS and/or IC devices that are integrally fabricated onto the device regions 214 using compatible glass (or silicon) wafer fabrication processes. These processes for fabricating MEMS or ICs are well known in the art. In other embodiments, the devices 240 can be fabricated separately, and then mounted onto the device regions 214. The devices 240 can be electrically connected to the conductive material in lesser vias 211a by known methods. For example, electrical connection can be established by flip-chip connection or bond wires and by depositing traces from the bond pads for the chips to the lesser vias 211a. As will be described below, electrical connection between the devices 240 and lesser vias 211a allows for electrical connection to the leads 230. Alternatively, the lesser vias can be omitted and surface traces on the front side can lead directly to the greater vias 211b. The devices 240 can be coated with a protective material, such as a silicone gel to prevent moisture incursion. In some embodiments, the capping substrate 220 can form a hermetic seal with the device substrate 210, thereby obviating any need for a coating under the lid. Integrated circuit fabrication techniques can be used to deposit, pattern and passivate interconnections among the devices 240 and lesser vias 211a, such that the interconnections are integrally formed with the device substrate 210 and are not shown for simplicity.

Figure 2D:
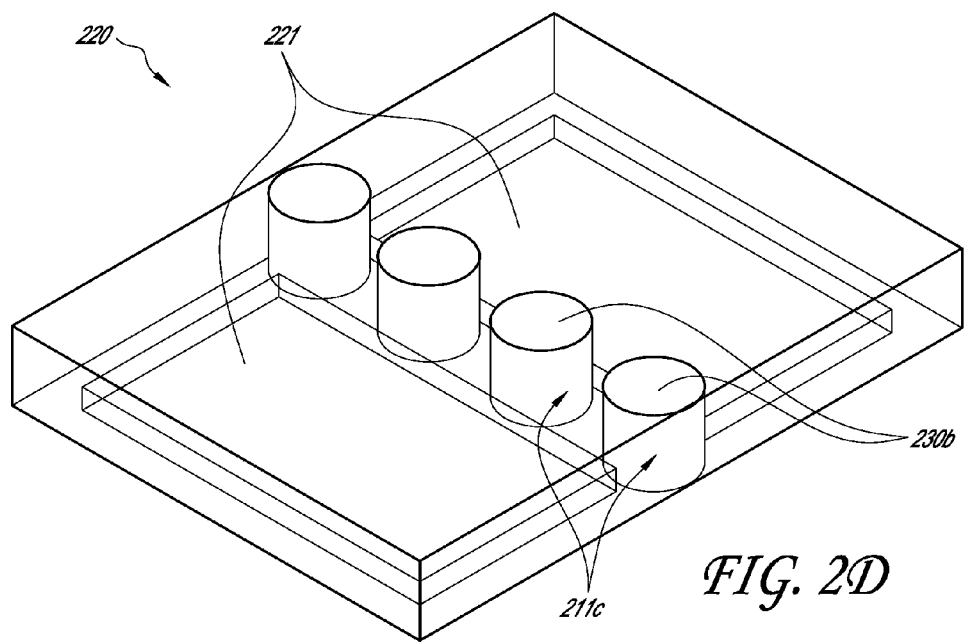

A portion of another substrate 220 representing two lids is illustrated in FIG. 2D. The capping substrate 220 includes pre-formed vias 211c that are configured to align with greater vias 211b on the device substrate 210. The pre-formed vias 211c on the capping substrate 220 can be filled with conductive material, using the processes described above with respect to the greater and lesser vias 211a and 211b of the device substrate 210. Filled with conductive material, the pre-formed vias 211c of the capping substrate 220 form second lead segments 230b. The capping substrate 220 also includes cavities 221, two shown in FIG. 2D, as illustrated, with one on either side of the pre-formed vias 211c.

Figure 2E:
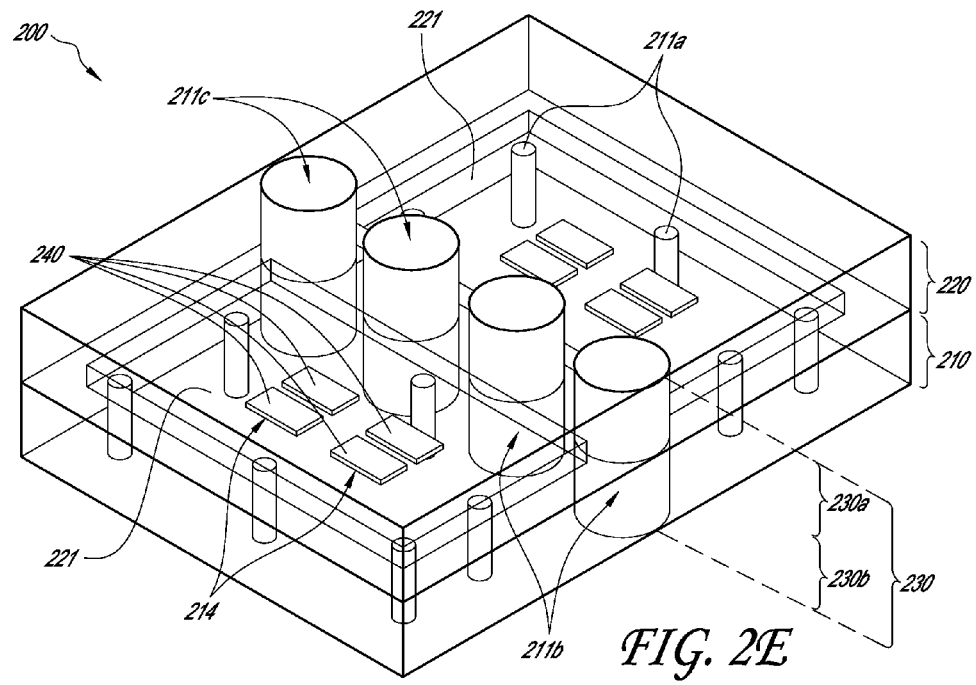

With reference to FIG. 2E, the capping substrate 220 is mounted over the front surface of the device substrate 210, together forming a package assembly 200. As illustrated, the pre-formed vias 211c are substantially aligned with the greater vias 211b of the device substrate 210. With both vias filled with conductive material, the first lead segment 230a of the substrate contacts the second lead segment 230b of the lid 200, together forming a single lead 230. Conductive adhesive can ensure good electrical contact. In the illustrated embodiment, showing the portion of the substrates 210, 220, representing two packages, four leads 230 are aligned down the center of the package assembly 200. As noted elsewhere, the package assembly can be diced down the center of these aligned leads 230, thereby forming separate packages. The capping substrate 220 can be bonded to the device substrate 210 by various methods. For example an adhesive such as epoxy can be used to secure the capping substrate 220 and device substrate 210 to one another, with conductive adhesive used between the lead segments 230a, 230b.

Figure 2F:
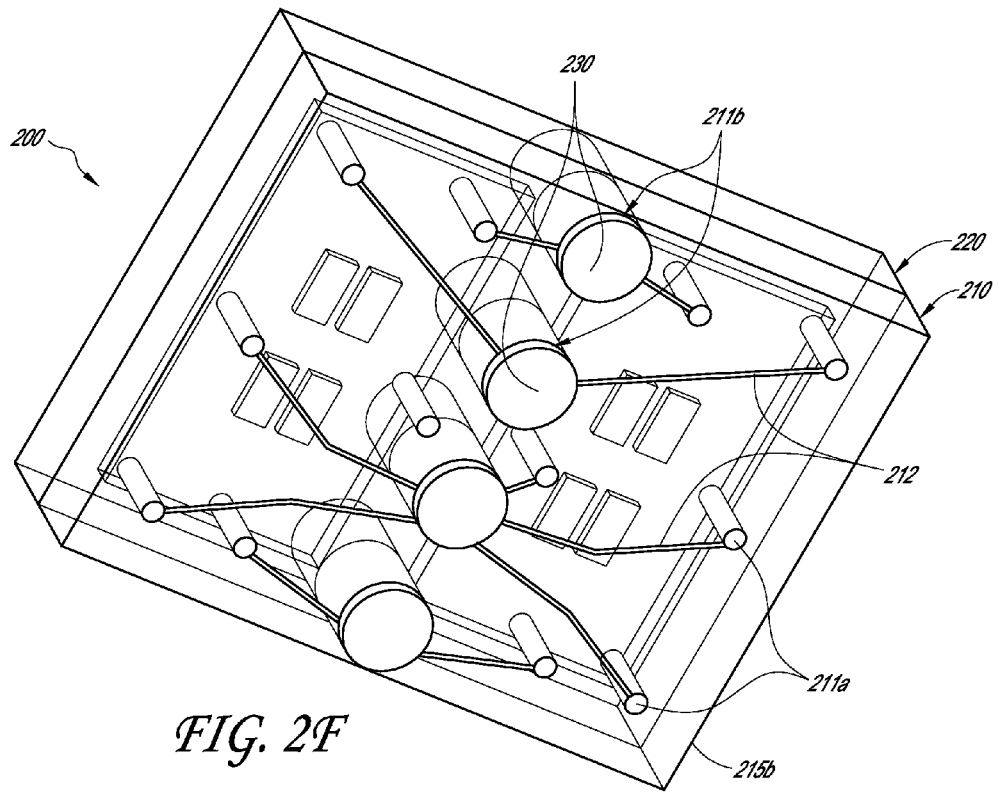

With reference to FIG. 2F, a plurality of traces 212 can be formed on the rear surface 215b of the device substrate 210. These traces can connect the conductive material within the lesser vias 211a with the leads 230 within greater vias 211b. The traces 212 can be formed using standard fabrication techniques. For example, formation of the traces 212 can be accomplished by depositing a layer of a conductive material, such as copper, over the rear surface 215b of the device substrate 210. Next, photolithography can be used to define an etch area, followed by wet or dry etching used to strip copper away from everywhere except for those portions which become traces 212. The photoresist can then be stripped from the rear surface. In other embodiments, the traces 212 can be deposited by sputtering copper through a mask defining the traces 212, rather than by depositing a blanket layer of copper, followed by an etching process. Alternatively, interconnections between the devices and the greater leads can be made on the front surface of the device substrate using semiconductor fabrication techniques.

Figure 2G:
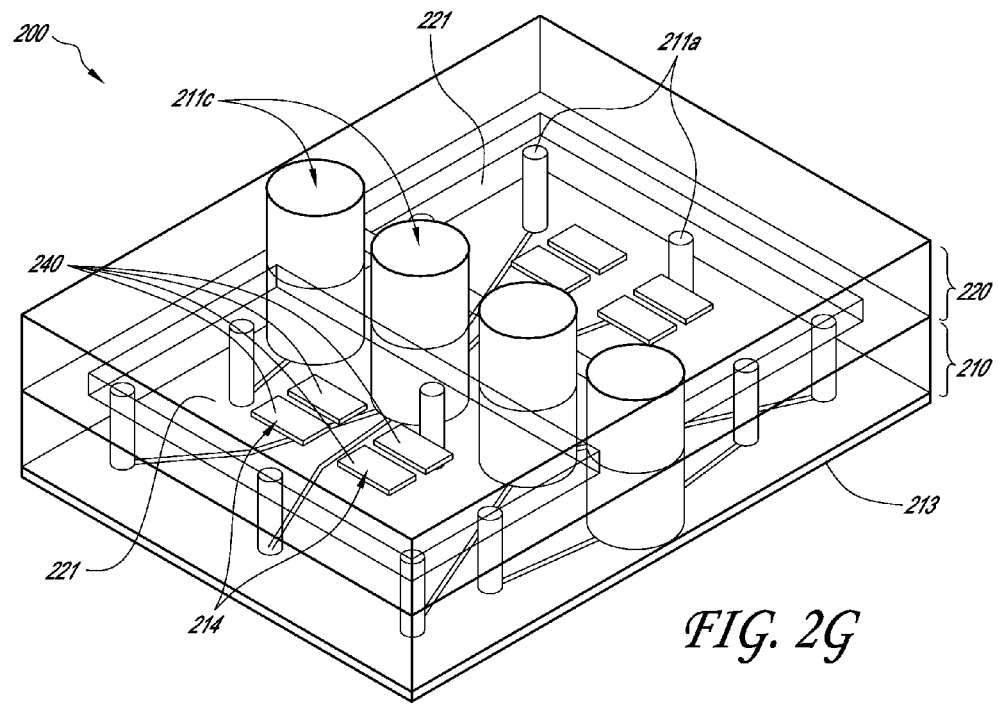

With reference to FIG. 2G, the rear surface 215b can be coated with a passivation layer 213, such as polyimide, thereby ensuring that the traces 212, and the bottom portions of the leads 230 and the lesser vias 211a are insulated from contamination and environmental stress.

Figure 2H:
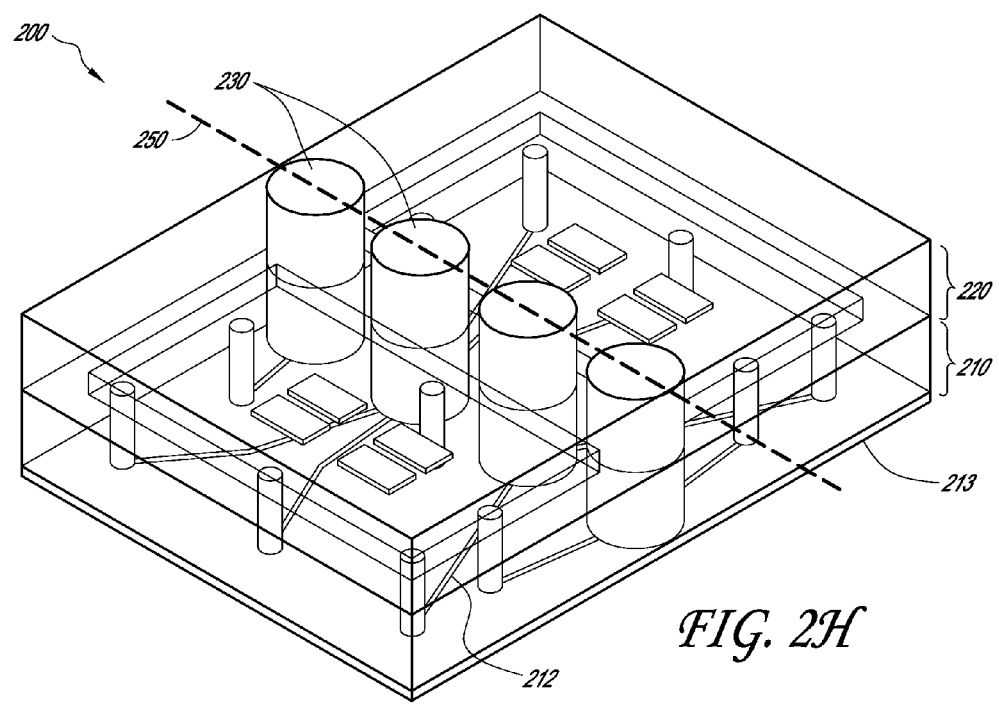

Referring now to FIG. 2H, following polyimide passivation, the package assembly 200 can be singulated using, e.g., a wafer saw to cut down the center axis 250 of the leads 230. It will be understood that in practice multiple cuts will be employed to singulate multiple packages from larger device substrates 210 and capping substrates 220 of the type shown in FIG. 2A. As noted above, the leads 230 are not exposed to the cavities 221. Accordingly, this singulation along axis 250 leaves the cavities 221 intact. The devices 240 are therefore encapsulated within the cavities 221. Depending upon the devices arranged in the packages, an opening to the cavity (e.g., a sound port for a MEMS microphone) can be provided. Once the package assembly has been singulated, each half includes exposed conductive elements that are half-cylinders of leads 230, including semi-circular exposed ends. As noted above, the leads can have other shapes depending on the shapes of the vias that they fill. The half-cylinders of leads 230 form vertical mount leads, allowing each half of the package assembly 200 to be rotated such that the half-cylinders of leads 230 face downward.

The exposed conductive portions of the half-cylinders of leads 230 can then be plated, for example to protect against oxidation or corrosion and improve solder-wettability. Examples of suitable plating include nickel palladium gold alloy (NiPdAu) or tin (Sn). As noted above with respect to FIG. 1, these vertical mount leads can then be used to physically mount and electrically connect the singulated package to a PCB or other substrate.

Figure 3:
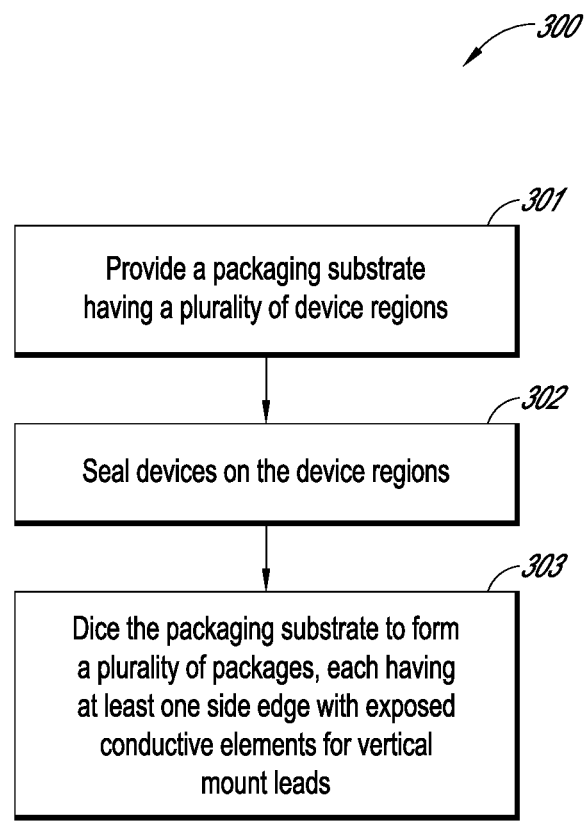
FIG. 3 is a flow diagram illustrating a method of making a MEMS package according to one embodiment.

Turning now to FIG. 3, a flow diagram illustrates a method for manufacturing a package in one embodiment. Process 300 begins with block 301. A device substrate is provided that includes a plurality of device regions. As noted above, this can be a glass or silicon substrate with a plurality of pre-formed vias. In other embodiments, the vias may be etched by the packager, rather than being pre-formed.

Process 300 continues with block 302, in which devices are sealed on the device regions. In some embodiments, the devices can include integrated circuits, ASICs, and/or MEMS structures. The devices can be fabricated directly onto the device regions using standard wafer processing techniques. In other embodiments, the devices can be separately manufactured and then mounted onto the device regions. The devices, particularly IC's, can be sealed onto the device regions by covering them with epoxy or standard deposited passivation layers used in semiconductor fabrication, such as SiON layers. MEMS devices, particularly motion sensors, are preferably not encapsulated to avoid stress. Rather, in other embodiments, a separate lid can be mounted over the device substrate, thereby sealing the devices on the device regions within sealed cavities allowing free MEMS membrane movement, either by individual planar or shaped lids, or by a capping substrate providing multiple lid regions over the multiple device regions. In embodiments including a separate capping substrate, the capping substrate can have through-substrate contacts aligned with through-substrate contacts of the device substrate. In some embodiments, the lid can comprise a plurality of recesses configured such that upon sealing the devices, each of the plurality of devices is encapsulated within one of the recesses. In other embodiments, recesses are provided in the device substrate in the device regions, or recesses are provided in both the device substrate and the capping substrate.

Process 300 continues with block 303, with dicing the device substrate to form a plurality of packages. Each of the packages resulting from the dicing includes at least one side edge with exposed conductive elements for vertical mount leads. In some embodiments, the dicing can be performed by cutting through a through-substrate contact, for example with a wafer saw. In some embodiments, the dicing can be followed by plating the exposed conductive elements.

The configurations described in the above embodiments can provide vertical mount packages having a low profile and improved performance. The packages can be made of insulating glass or silicon. Additionally, the transparent lid can provide an optical path for optical sensors or emitters, and the substrate glass can be doped so as to match the CTE of the substrate with that of the devices, such as integrated devices or mounted dies. Further, the packages can be made at a relatively low cost.

Applications

The embodiments described above can be adapted for various types of MEMS devices, including, but not limited to: optical sensors, RF MEMS, inertial sensors (for example, gyroscopes and accelerometers), MEMS thermal sensors, microphone, and pressure sensors. The packages have particular utility for packaging vertically mounted sensors, such as gyroscopic angular motion sensors, to achieve the detection at a certain orientation. For such applications, the devices can be hermetically sealed within package cavities, and the simple construction is particularly robust for environments (e.g., automobiles) subject to high vibrations.

More generally, packages employing the above described configurations can be used for various electronic devices. Examples of the electronic devices can include, but are not limited to, automotive applications, such as automotive sensors, consumer electronic products, parts of the consumer electronic products, electronic test equipments, etc. The consumer electronic products can include, but are not limited to, vehicles (for example, stability control devices), a mobile phone, cellular base stations, a telephone, a television, a computer monitor, a computer, a hand-held computer, a netbook, a tablet computer, a digital book, a personal digital assistant (PDA), a game controller, a GPS, a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "mounted" or "attached" together. As used herein, unless expressly stated otherwise, "mounted" means that one element/feature is directly or indirectly connected to another element/feature. Likewise, unless expressly stated otherwise, "attached" means that one element/feature is directly or indirectly coupled to another element/feature, such as adhesive layers. Thus, although the various schematics shown in the figures depict example arrangements of elements and components, additional intervening elements, devices, features, or components may be present in an actual embodiment.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of manufacturing a vertical mount package, the method comprising:
   providing a device substrate comprising a front surface including a plurality of device regions, and a rear surface opposite the front surface, wherein the device substrate comprises glass or silicon;
   sealing devices in the device regions on the device substrate;
   dicing the device substrate to form a plurality of packages, wherein each package comprises a plurality of side edges between the front and rear surfaces, at least one of the side edges including exposed conductive elements for vertical mount leads, and wherein each of the plurality of packages includes at least one device region.

2. The method of claim 1, wherein the devices comprise a plurality of MEMS structures fabricated on the device regions.

3. The method of claim 2, wherein the plurality of MEMS structures comprises at least one of: motion sensors and gyroscopes.

4. The method of claim 1, wherein the devices include integrated circuits integrally formed in the device substrate.

5. The method of claim 1, wherein the devices include MEMS or IC dies separately formed and mounted onto the device substrate.

6. The method of claim 1, wherein sealing devices comprises covering the device regions with epoxy.

7. The method of claim 1, wherein sealing devices comprises mounting a capping substrate onto the device substrate before dicing.

8. The method of claim 7, wherein the device substrate and the capping substrate each include through-substrate contacts, and wherein the capping substrate is mounted onto the device substrate such that the through-substrate contacts are aligned.

9. The method of claim 7, wherein the capping substrate comprises a plurality of recesses configured such that each diced package includes one recess.

10. The method of claim 7, wherein the capping substrate comprises a plurality of recesses configured such that each diced package includes two or more recesses.

11. The method of claim 7, wherein the capping substrate is made of glass.

12. The method of claim 1, wherein the device substrate comprises a wafer.

13. The method of claim 1, wherein dicing the device substrate comprises cutting through a through-substrate contact.

14. The method of claim 1, further comprising plating the exposed conductive elements after dicing.

15. A method of manufacturing a vertical mount package, the method comprising:
   providing a device substrate comprising a plurality of through-substrate contacts extending between front and rear surfaces of the device substrate, the device substrate having a plurality of devices sealed on the front surface of the device substrate, wherein the device substrate comprises glass or silicon; and
   dicing the device substrate through at least some of the plurality of through-substrate contacts, each of the severed through-substrate contacts forming a vertical mount lead.

16. The method of claim 15, wherein the device substrate is made of glass.

17. The method of claim 15, wherein the plurality of devices comprises a plurality of MEMS structures fabricated on the front surface of the device substrate.

18. The method of claim 15, wherein the plurality of devices comprises a plurality of integrated circuits formed in the device substrate.

19. The method of claim 15, wherein the plurality of devices include MEMS or IC dies separately formed and mounted onto the device substrate.

20. The method of claim 15, wherein at least one of the plurality of devices is arranged in each of a plurality of device regions that are separated during the dicing.

21. The method of claim 15, wherein dicing the device substrate comprises using a wafer saw to cut through at least some of the plurality of through-substrate contacts.

22. A vertical mount package comprising:
a device substrate comprising a front surface and a rear surface opposite the front surface, wherein the device substrate comprises glass or silicon;
at least one device sealed on the front surface of the device substrate; and
a plurality of side edges extending between the front and rear surfaces of the device substrate, at least one of the side edges including exposed conductive elements for vertical mount leads.

23. The vertical mount package of claim 22, further comprising
a capping substrate comprising a front surface and a rear surface opposite the front surface, the capping substrate disposed over the device substrate such that the rear surface of the capping substrate faces the front surface of the device substrate;
a plurality of side edges extending between the front and rear surfaces of the capping substrate, at least one of the side edges including exposed conductive elements; and
wherein the at least one device is sealed on the front surface of the device substrate within a cavity defined by the device substrate and the capping substrate.

24. The vertical mount package of claim 23, wherein the plurality of side edges extends between the front surface of the capping substrate and the rear surface of the device substrate, and wherein the exposed conductive elements extend from the front surface of the capping substrate to the rear surface of the device substrate.

25. The vertical mount package of claim 22, wherein the at least one device comprises a MEMS device.

26. The vertical mount package of claim 24, wherein a majority of the surface of the exposed conductive elements faces a side edge, and wherein a minority of the surface of the exposed conductive elements faces the front surface of the capping substrate or the rear surface of the device substrate.

27. The vertical mount package of claim 23, wherein the exposed conductive elements comprise substantially hemicylindrical structures.

28. The vertical mount package of claim 23, wherein the front and rear surfaces of the packaging and capping substrates are configured to be substantially parallel to the vertical upon mounting the package.

29. The vertical mount package of claim 23, wherein a major surface of the at least one device is configured to be substantially parallel to the vertical upon mounting the package.

30. The vertical mount package of claim 23, wherein the at least one device comprises a MEMS device having a movable beam, and wherein the movable beam is configured to be substantially parallel to the vertical upon mounting the package.

31. The vertical mount package of claim 25, wherein the MEMS device comprises one of a motion sensor and a gyroscope.

32. The vertical mount package of claim 22, wherein the at least one device is integrally fabricated with the device substrate.

33. The vertical mount package of claim 22, wherein the at least one device is separately formed and mounted onto the device substrate.

34. The vertical mount package of claim 22, wherein the front and rear surfaces of the device substrate are configured to be substantially parallel to the vertical upon mounting the package.

35. The vertical mount package of claim 22, wherein a majority of the surface of the exposed conductive elements faces a side edge, and wherein a minority of the surface of the exposed conductive elements faces the front or rear surfaces of the device substrate.

36. The vertical mount package of claim 24, wherein the exposed conductive elements are embedded in the device substrate and the capping substrate.

37. The vertical mount package of claim 22, wherein the at least one device is sealed on the front surface of the device substrate with an epoxy.

* * * * *